(12) United States Patent
Matsumoto et al.

(10) Patent No.: US 7,175,399 B2
(45) Date of Patent: Feb. 13, 2007

(54) SERIAL VENTILATION DEVICE

(75) Inventors: Kaoru Matsumoto, Miyota-Machi (JP); Shuichi Otsuka, Miyota-Machi (JP)

(73) Assignee: Minebea Co., Ltd., Nagano (JP)

( * ) Notice: Subject to any disclaimer, the term of this patent is extended or adjusted under 35 U.S.C. 154(b) by 282 days.

(21) Appl. No.: 10/612,116

(22) Filed: Jul. 2, 2003

(65) Prior Publication Data

US 2004/0076517 A1    Apr. 22, 2004

(30) Foreign Application Priority Data

Jul. 5, 2002    (JP)    ............... 2002-197289

(51) Int. Cl.
F04B 23/00    (2006.01)
(52) U.S. Cl. .............. 417/423.15; 417/423.14
(58) Field of Classification Search ............. 417/423.1, 417/423.14, 423.3, 247, 246, 423.5, 244, 417/423.15, 313, 326, 410.1; 416/120 X, 416/126, 128; 415/60 X, 62 X, 68, 69; 261/26, 88, 89

See application file for complete search history.

(56) References Cited

U.S. PATENT DOCUMENTS

| | | | | |
|---|---|---|---|---|
| 1,541,443 A | * | 6/1925 | Rolf | ................ 34/83 |
| 1,866,127 A | * | 7/1932 | Persons | ............ 475/184 |
| 1,968,874 A | * | 8/1934 | Forrest | ............ 34/191 |
| 2,288,154 A | * | 6/1942 | Fornest | ............ 34/475 |
| 2,325,222 A | * | 7/1943 | Bretzlaff et al. | ......... 417/350 |
| 3,054,230 A | * | 9/1962 | Logue | ............ 451/326 |
| 3,315,488 A | * | 4/1967 | Lind | ............ 62/241 |
| 3,347,310 A | * | 10/1967 | Lind et al. | ............ 165/124 |
| 3,387,769 A | * | 6/1968 | Hunt | ............ 415/62 |
| 4,098,008 A | * | 7/1978 | Schuette et al. | ............ 34/191 |
| 4,604,032 A | * | 8/1986 | Brandt et al. | ............ 416/128 |
| 5,007,241 A | * | 4/1991 | Saitou | ............ 60/698 |
| 5,546,272 A | | 8/1996 | Moss et al. | |
| 5,572,403 A | * | 11/1996 | Mills | ............ 361/695 |
| 5,980,218 A | * | 11/1999 | Takahashi et al. | .......... 417/243 |
| 5,984,649 A | * | 11/1999 | Kato et al. | ............ 417/423.5 |
| 6,129,528 A | * | 10/2000 | Bradbury et al. | ......... 417/423.1 |
| 6,158,985 A | * | 12/2000 | Watanabe et al. | ...... 417/423.14 |
| 6,244,818 B1 | | 6/2001 | Chang | |

(Continued)

FOREIGN PATENT DOCUMENTS

DE    2503623    8/1976

(Continued)

*Primary Examiner*—Charles Freay
*Assistant Examiner*—Vikansha Dwivedi
(74) *Attorney, Agent, or Firm*—Joel E. Lutzker, Esq.; Jason Marin, Esq.; Schulte Roth & Zabel

(57) ABSTRACT

An apparatus for a serial ventilation device that increases airflow compared to conventional devices without increasing the size is presented. The first ventilator is mounted on the intake opening side of the serial ventilation device, with the front surface of its blades facing the air intake side. The second ventilator is mounted on the exhaust opening side of the serial ventilation device, with the front surface of its blades facing the air exhaust side. Thus a first ventilator, which ventilates from the rear side of the ventilator, and a second ventilator, which ventilates from the front side of the ventilator, operate as a whole. Both ventilators are connected serially such that their rotation shafts are positioned coaxially, while the number of blades of the two ventilators are different.

10 Claims, 6 Drawing Sheets

U.S. PATENT DOCUMENTS

| | | |
|---|---|---|
| 6,396,688 B1 | 5/2002 | Davies et al. |
| 6,517,326 B2 * | 2/2003 | Fujinaka et al. ............ 417/354 |
| 6,537,019 B1 * | 3/2003 | Dent ........................... 415/61 |
| 6,626,653 B2 | 9/2003 | Lin et al. |

FOREIGN PATENT DOCUMENTS

| | | |
|---|---|---|
| EP | 0761982 A1 | 3/1997 |
| TW | 471562 Y | 1/2002 |

* cited by examiner

VIEW A

VIEW B

SERIAL VENTILATION DEVICE

CROSS-REFERENCE TO RELATED APPLICATIONS

This application claims priority from Japanese Patent Application No. 2002-197289 filed on Jul. 5, 2002.

BACKGROUND OF THE INVENTION

1. Field of Invention

The present invention relates to an apparatus for a ventilation device, such as that used for exhausting heat generated inside the case of electronics devices or equipment to the exterior, and more particularly to a serial ventilation device in which two ventilators are placed longitudinally and operate at the same time.

2. Description of the Related Art

In electronic devices in which many electronic components are housed in a relatively small case, such as office equipment like personal computers and copiers, heat generated by these electronic components collects inside the case and there is concern that the electronic components will experience heat failure.

Accordingly, vent holes have been created in the walls or roof of the cases for these electronic devices and ventilators attached to these vent holes exhaust the heat inside the case to the outside. As methods to force heat exhaust using ventilators there is the normal method, using one ventilator, and the serial operation and parallel operation methods, using two ventilators with good external shape and characteristics in combination at the same time.

In the serial operation method, two ventilators are placed longitudinally facing the same direction such that their rotation shafts are positioned in a straight line and they operate in the same direction at the same time. This method is designed mainly to increase static pressure P. In the parallel operation method, two ventilators are mounted laterally facing the same direction such that their rotation shafts are positioned in parallel and they operate in the same direction at the same time. This method is designed mainly to increase airflow Q.

Accordingly, engineers select the serial operation method or the parallel operation method depending on physical conditions, such as the available mounting space for two ventilators, and/or required specifications such as which of increasing static pressure P or airflow Q has priority. However, in recent years, the miniaturization of electronic devices has been remarkable and the consequent need for improvement in the heat exhaust characteristics required for ventilation devices is notable. For instance, in ventilation devices using the serial operation method (i.e., serial ventilation devices) the effect of even a small increase in airflow Q on the efficiency of exhausting heat generated inside an electronics device's case is large. Accordingly, even for serial ventilation devices recently there have been demands for further increases in airflow Q without increasing the size.

SUMMARY OF THE INVENTION

Accordingly, the present invention is directed to a serial ventilation device that increases airflow Q without increasing the size.

The construction of the serial ventilation device of the present invention is characterized by a casing of almost equal external dimensions housing the body of the ventilators including the blades. The device has a first ventilator which performs regular ventilation to the rear side of the blades, and a second ventilator which performs regular ventilation to the front side of the blades, when the front side of the blades of both ventilators are facing the same direction and rotating in the same direction. The first ventilator is mounted on the air intake opening side of the device, with the front surface of its blades facing the air intake side. The second ventilator is mounted on the air exhaust opening side of the device, with the front surface of its blades facing the air exhaust side. Both ventilators are placed in succession in a serial state, with the rotation shafts positioned on the same line, and the number of blades of the first ventilator is different from the number of blades of the second ventilator.

An embodiment of the invention is characterized by external dimensions of the casings for each of the ventilators being formed such that they are perforated with assembly holes in the same location at each corner and, in each casing, screw holes or notches in order to mutually connect the ventilator locate in a position that is contiguous when the ventilators are placed in series, excluding the position on straight lines that link the assembly holes of the ventilators.

An embodiment of the present invention is further characterized by external dimensions of the casing formed in a rectangle, and, in the area of this rectangle, excluding the square area within the rectangle that houses the body of the ventilators, screw holes or notches located in order to mutually connect the ventilators.

Yet another embodiment of the present invention is characterized by external dimensions of the casing formed in a square, and, in the area of this square, excluding the square area within the square that houses the body of the ventilators, screw holes or notches located in order to mutually connect the ventilators.

The present invention, including its features and advantages, will become more apparent from the following detailed description with reference to the accompanying drawings.

DETAILED DESCRIPTION

Below, the different embodiments of the present invention are explained with reference to the drawings. It should be noted that each figure shows an embodiment in which a fan motor is used in each ventilator. It should be further noted that in FIG. 2, the ventilator mounted on the exhaust opening side is omitted except for the fan motor assembly holes.

Figure 1:
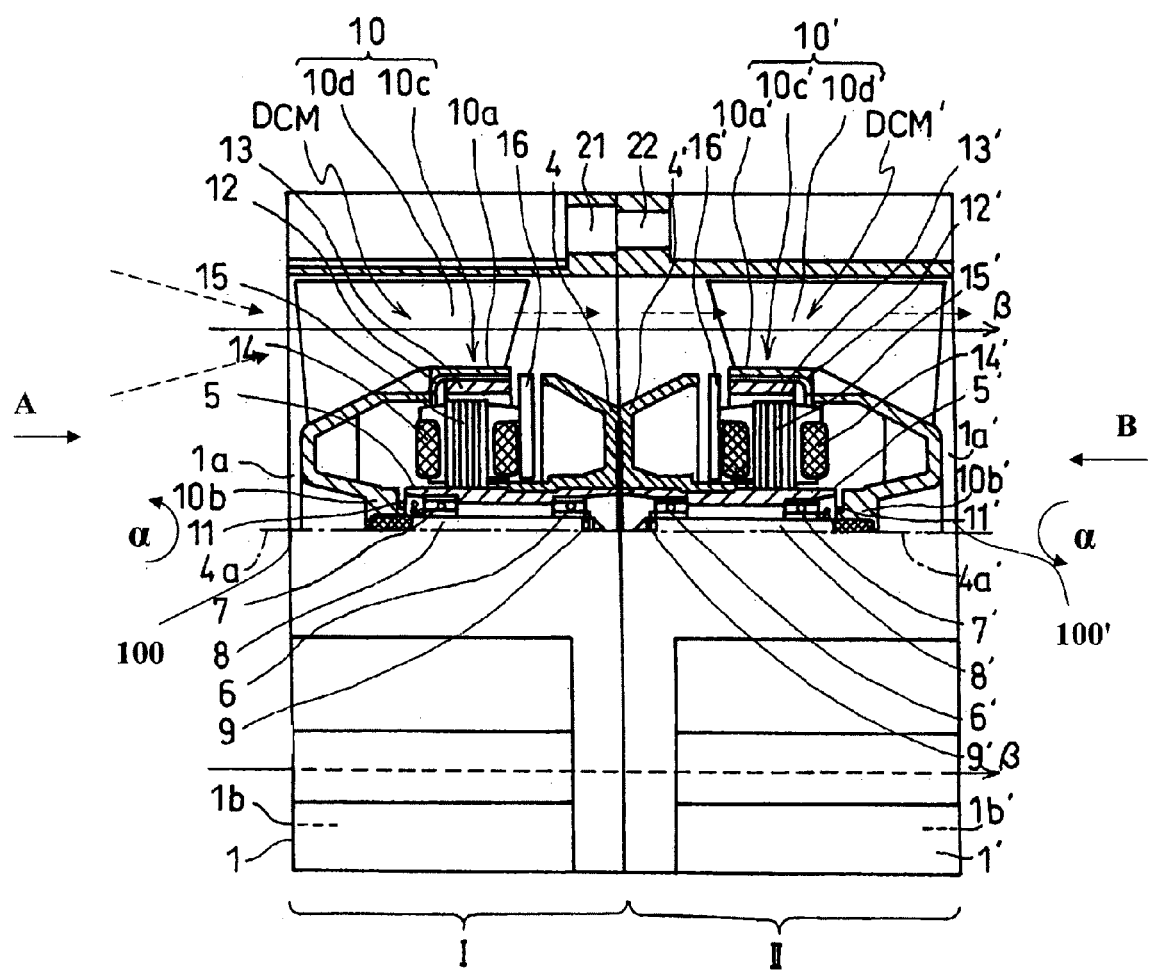
FIG. 1 is a side view of the serial ventilation device, according to the first embodiment of the present invention, showing the cross-section of the upper-half of the serial ventilation device.
Figure 2:
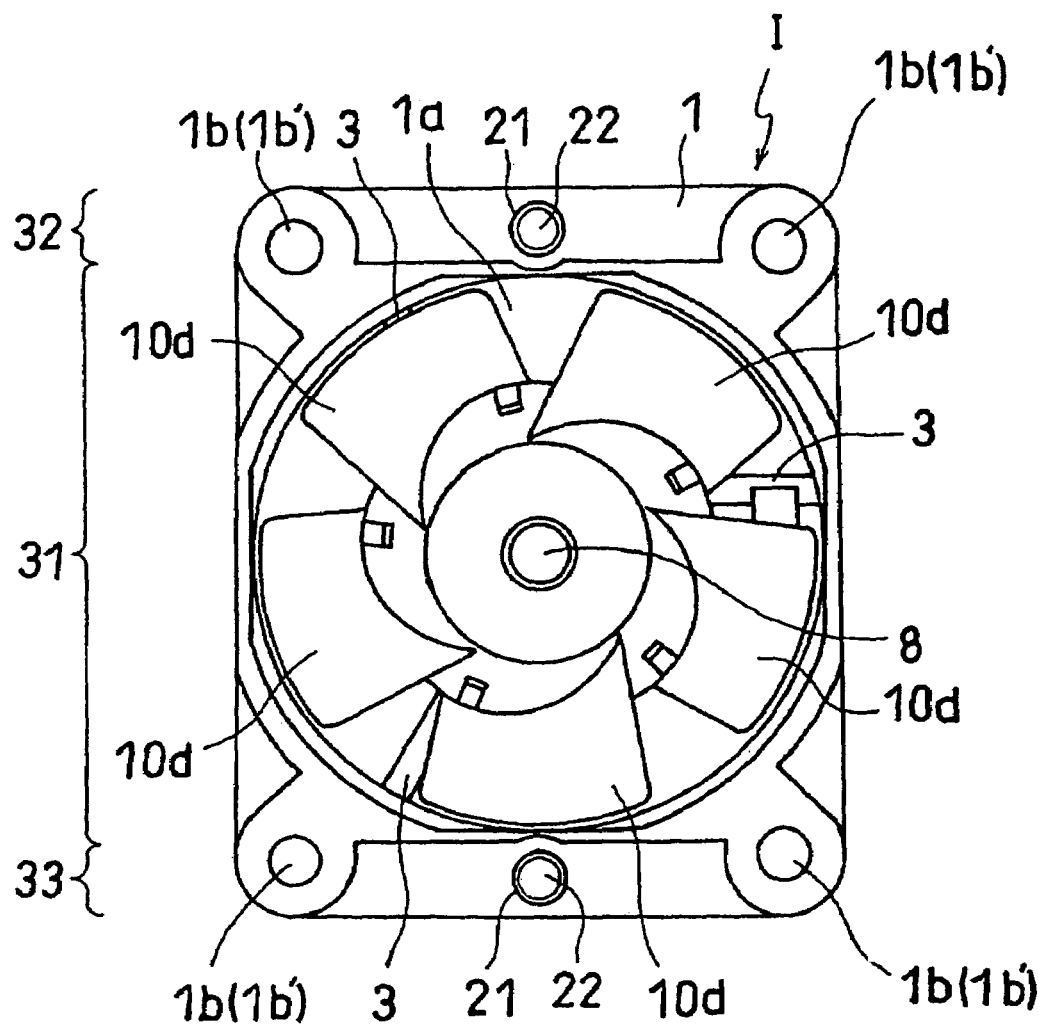
FIG. 2 is a drawing showing the serial ventilation device of FIG. 1 from the intake opening side.

Referring now to FIGS. 1 and 2, a first fan motor I (a first ventilator) is mounted on an air intake opening side of the ventilation device, and a second fan motor II (a second ventilator) is mounted on an air exhaust opening side of the ventilation device. The front surface of the blades of fan motor I face the air intake side while the front surface of the blades of fan motor II face the air exhaust side. Both fan motors I and II are formed with almost equal external dimensions, as can be seen in FIG. 1, and have almost the same configuration, with the exception of the difference in a ventilation side, face direction and number of the blades. For the sake of brevity, the common structure of the first and second fan motors are described below using only the elements of fan motor I. The elements of fan motor II that are the same as those of fan motor I are indicated by the same reference numbers with a prime. Explanation of these same elements is accordingly omitted.

Fan motor I has rectangular (vertical) casing 1, wherein circular air vent 1a is formed in the center region of square area 31, which is positioned in the center region of the vertical direction of that rectangle. Assembly holes 1b are formed in each corner to assemble fan motor I to the device case (not shown).

In the center region of air vent 1a in casing 1, motor base 4 is held fixed by ribs 3 (in this case three ribs), that extend from the surrounding edge of the opening of air vent 1a. Tubular bearing support 5 is anchored to the center region of this motor base 4. The outer races of two bearings 6 and 7 are supported at an interval inside bearing support 5, and motor rotation shaft 8 is inserted into and supported by the inner circumference of bearings 6 and 7. Retaining ring 9 is mounted to the end of rotation shaft 8 and prevents slipping of rotation shaft 8 as well as fixing the axial direction.

Fan motor I further has an impeller 10, wherein multiple blades 10d are arranged at equal intervals in the direction of rotation on an outer circumference of impeller body 10c, which has a cylinder 10a and a boss 10b. This impeller 10 is coupled to the rear end of rotation shaft 8 by boss 10b, which is positioned above the central axis 4a of impeller body 10c and cylinder 10a, and is configured such that blades 10d rotate around rotation shaft 8 when rotation shaft 8 rotates. Coil spring 11 is fitted between the inner face of bearing 7 and boss 10b, providing deflection force to boss 10b, and thus to impeller 10, in the direction of the rear end of rotation shaft 8. As shown in FIG. 1, when the ventilation device is assembled, axis 4a of the rotation shaft 8 coincides with axis 4a of the rotation shaft 8', so that shafts 8 and 8' are coaxially to each other.

A nearly cylindrical motor yoke 12 is inserted and mounted to the inner circumference of impeller 10 and cylinder 10a, and cylindrical permanent magnet 13 is affixed to the inner circumference of this motor yoke 12. Along with the motor yoke 12 and permanent magnet 13, a direct current motor (DCM) comprising stator coil 14 and a stator iron core 15, conducted by stator coil 14, are fixed to the exterior of bearing support 5. In the vicinity of stator iron core 15, a circuit board, in this case PC board 16, is positioned that has electronic circuits for supplying a fixed current to stator coil 14. The electronic circuits on PC board 16 controls the electric current supply to stator coil 14 in order to make the motor yoke 12 permanent magnet 13 side rotate against the stator 14 iron core 15 side. Although not shown in the figures, lead wires that supply electric power to PC board 16 are connected to PC board 16.

Figure 3:
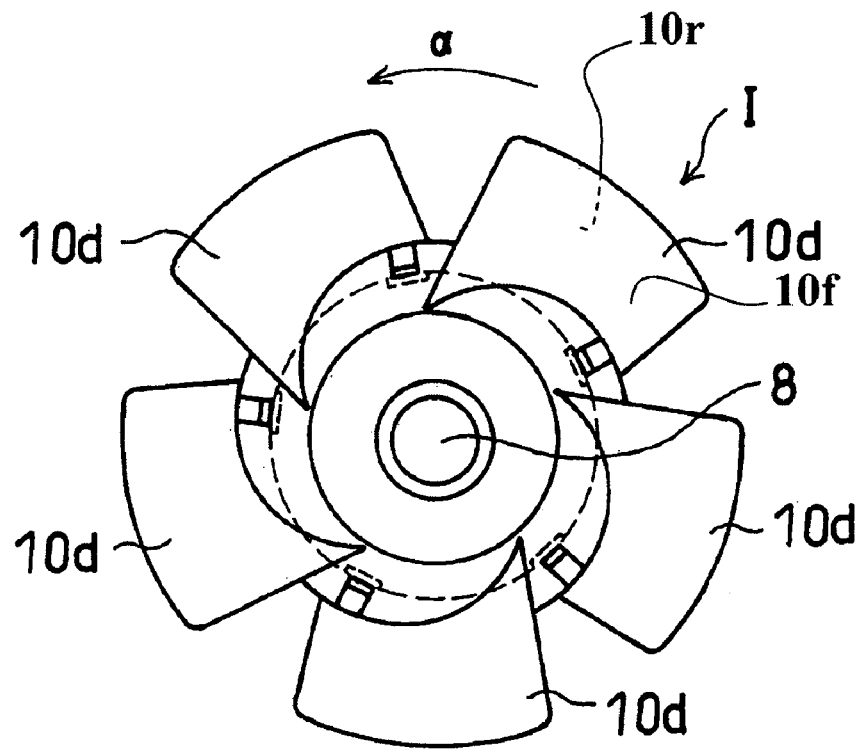
FIG. 3 is a front view of the first fan motor blades and the peripheral area.
Figure 4:
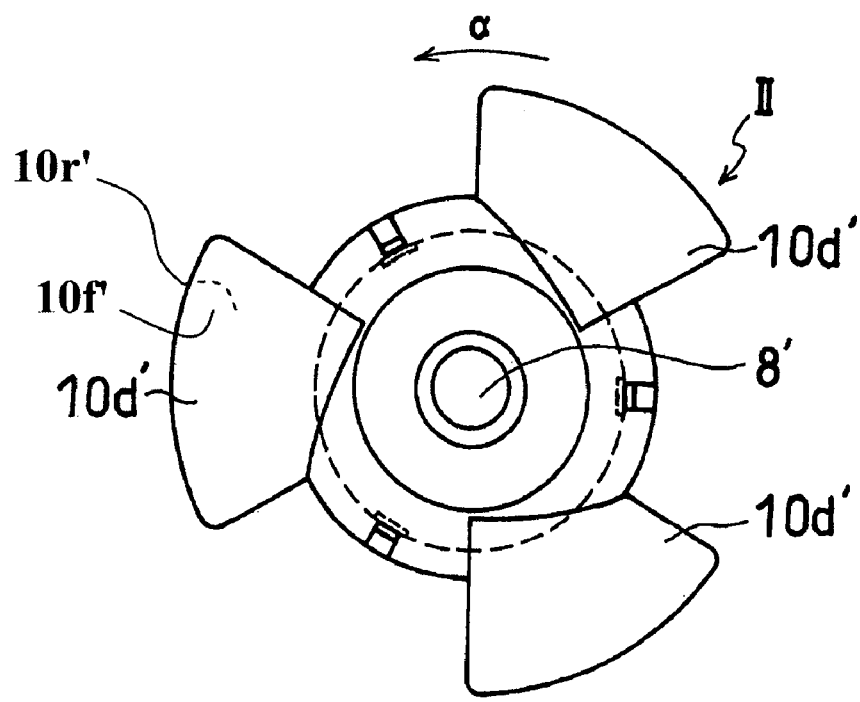
FIG. 4 is a front view of the second fan motor blades and the peripheral area.

Referring now to FIGS. 3 and 4, the ventilation side, face direction and number of the blades of fan motors I and II are described as follows.

The ventilation blade surfaces of fan motors I and II are in the same direction. In other words, the front side facing the observer direction. Moreover they are configured such that, when rotating in the same counter-clockwise direction a (forward rotation), fan motor I performs regular ventilation to the rear side of the blade surface and fan motor II performs regular ventilation to the front side of the blade surface. Accordingly, regular ventilation is ventilation in the direction actively intended in the design of fan motors I and II.

In addition, the number of blades 10d of fan motor I is comparatively greater than the number of blades 10d' of fan motor II. In an embodiment shown by the drawing, the number of fan motor I blades 10d is five and the number of fan motor II blades 10d' is three. It is to be understood, of course, that while the number of blades 10d of fan motor I is greater than the number of blades 10d' of fan motor II, that it is acceptable to make the number of blades 10d' of fan motor II greater than the number of blades 10d of fan motor I. In this embodiment as well, the same effect (airflow increase) as the above embodiment is obtained. Further, it is also to be understood, of course, that more or less blades may be used depending on specifications.

Figure 5:
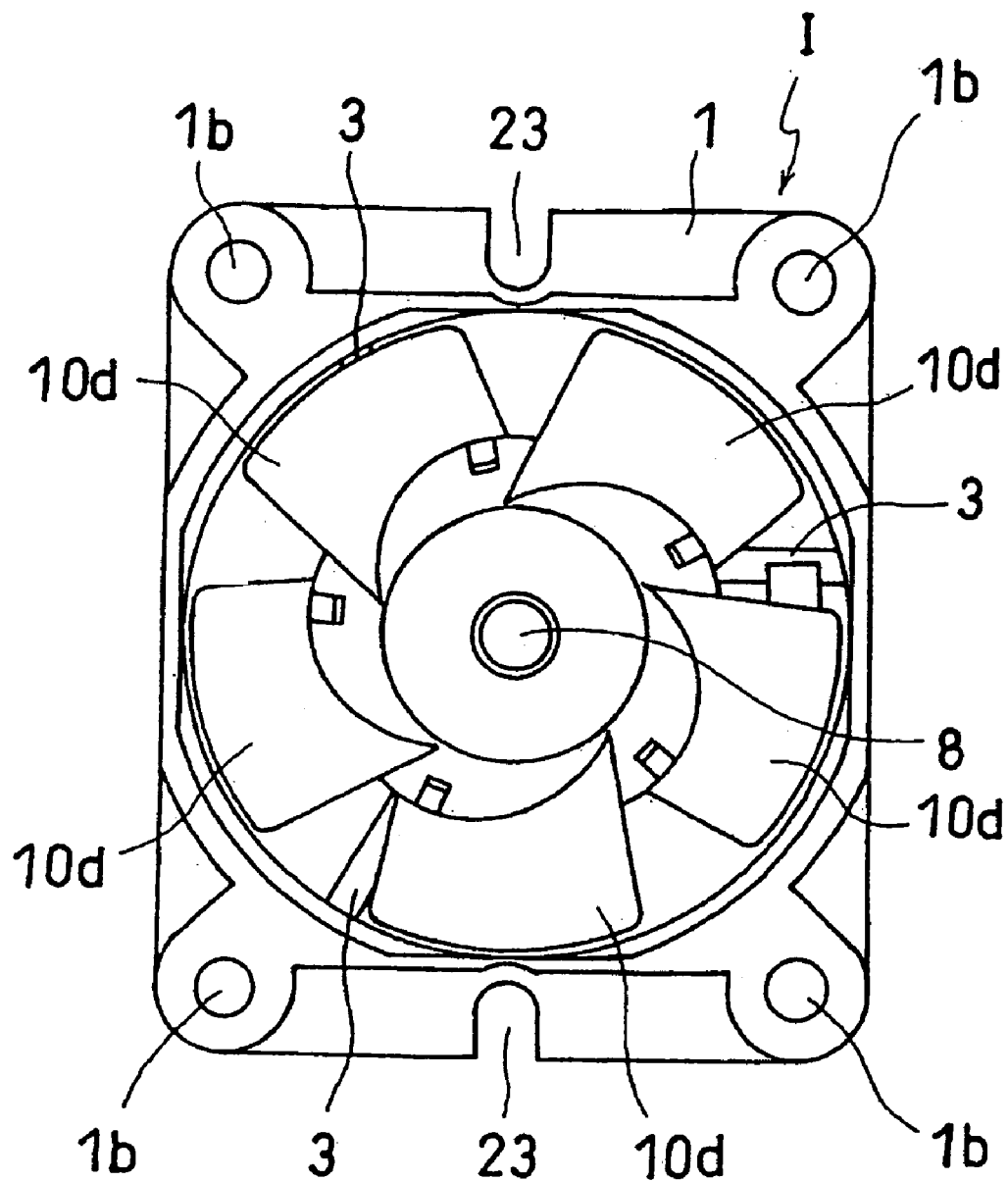
FIG. 5 is a front view of the first fan motor with notches drilled in the casing instead of holes.

Referring again to FIGS. 1 and 2, and now also to FIG. 5, both fan motors I and II are connected by screws, however, it is to be understood that it is acceptable to use other methods to connect them. In the case that fan motors I and II are connected by screws, screw holes or notches are drilled into fan motors I and II. As shown in FIGS. 1 and 2, hole 21 with a diameter larger than the screw portion of the self-tapping screw (not shown) used for connecting is drilled through the side of the fan motor I and hole 22 with a diameter slightly smaller than that same screw portion is drilled through the side of the fan motor II. In this configuration, fan motors I and II are connected by screwing the self-tapping screw through the fan motor I hole 21 to the fan motor 11 hole 22.

Regarding the fan motor I side, instead of hole 21, drilling a notch 23 as shown in FIG. 5 is acceptable. In this manner, work to connect fan motors I and II is made easier by omitting the alignment of the self-tapping screw end to hole 21 shown in FIGS. 1 and 2. Although not shown, it is also acceptable to make the holes in fan motors I, II of equal diameter and connect fan motors I and II by inserting a bolt through the holes and screwing a nut onto the end of the bolt. In this example as well, by drilling a notch instead of a hole in the fan motor I side, work to connect fan motors I, II is made easier.

Regarding the positioning of the holes 21, 22 and notch 23 (in other words the screw location) any position is acceptable except for a position in a straight line above the fan motor assembly holes 1b, 1b' in casings 1, 1'. In other words, as long as it is a position that does not impede assembly of the serial ventilation device of the present invention at the desired position using holes 1b, 1b'.

In an embodiment wherein casings 1, 1' are formed in a rectangular shape as shown in FIGS. 1 and 2, it is acceptable to set the screw position anywhere in rectangular regions 32 and 33, except for the square region 31 that houses the fan motor itself (roughly the structural portion of the device excepting casings 1, 1'). In this manner, positioning of the screw holes or notches (holes 21, 22; notch 23) for connecting fan motors I and II is made easier.

Figure 6:
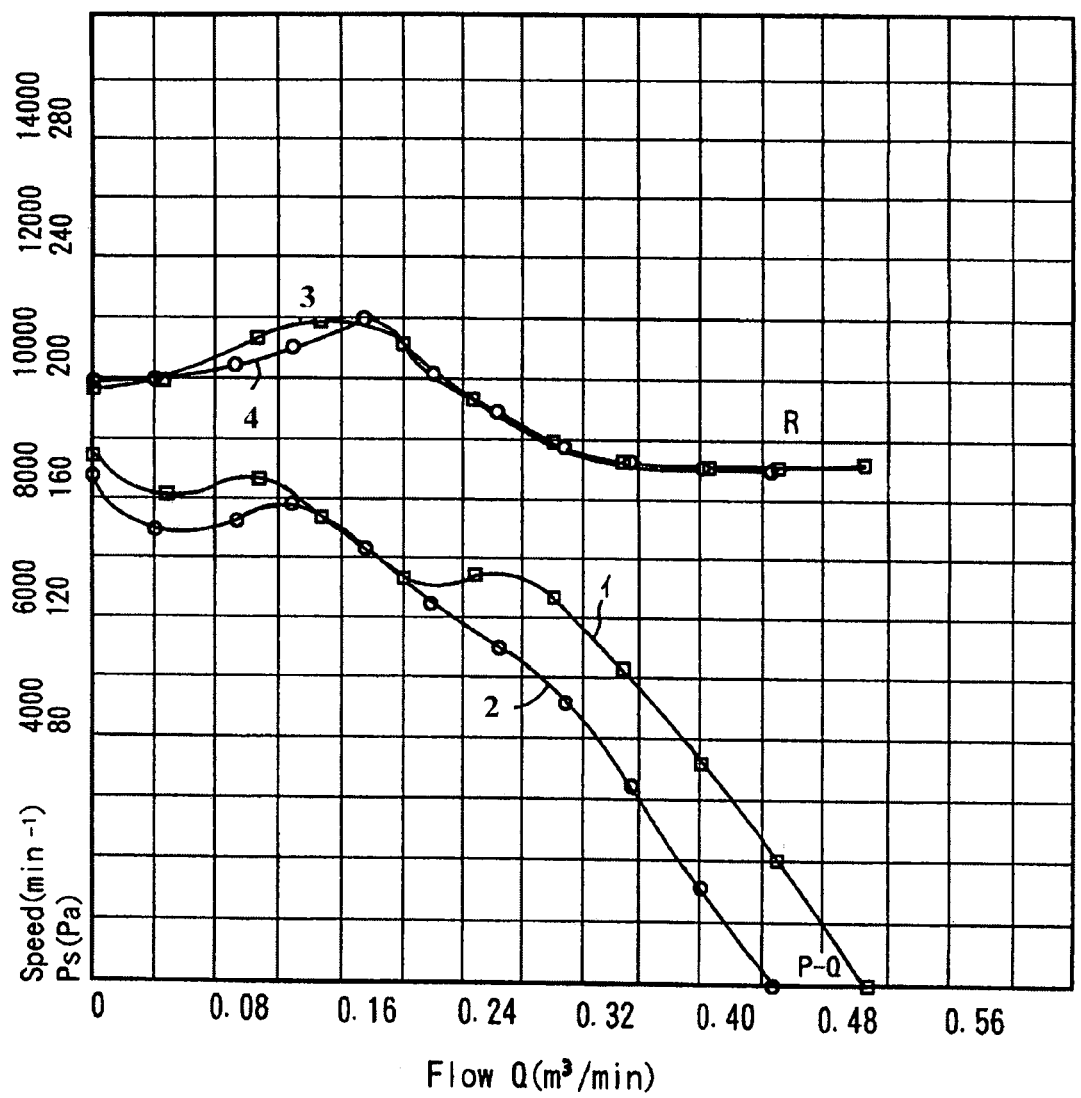
FIG. 6 is a graph showing the P–Q characteristics of the present invention along with those of a conventional ventilation device.

Referring now to FIG. 6, the static pressure P and air flow Q characteristics of the serial ventilation device of an embodiment of the present invention are shown. A flag R for the same characteristics for a conventional serial ventilation device (conventional device) are also shown. Curve 1 shows the P–Q characteristics of the present invention and curve 2 shows the P–Q characteristics of the conventional device. Further, curve 3 shows the rotation speed-airflow characteristics of the present invention and curve 4 shows the rotation speed-airflow characteristics of the conventional device.

As shown in this figure, improvement (airflow increase) can be seen in the P–Q characteristics, particularly in the airflow P–Q characteristics, of present invention compared to the conventional device.

Figure 7:
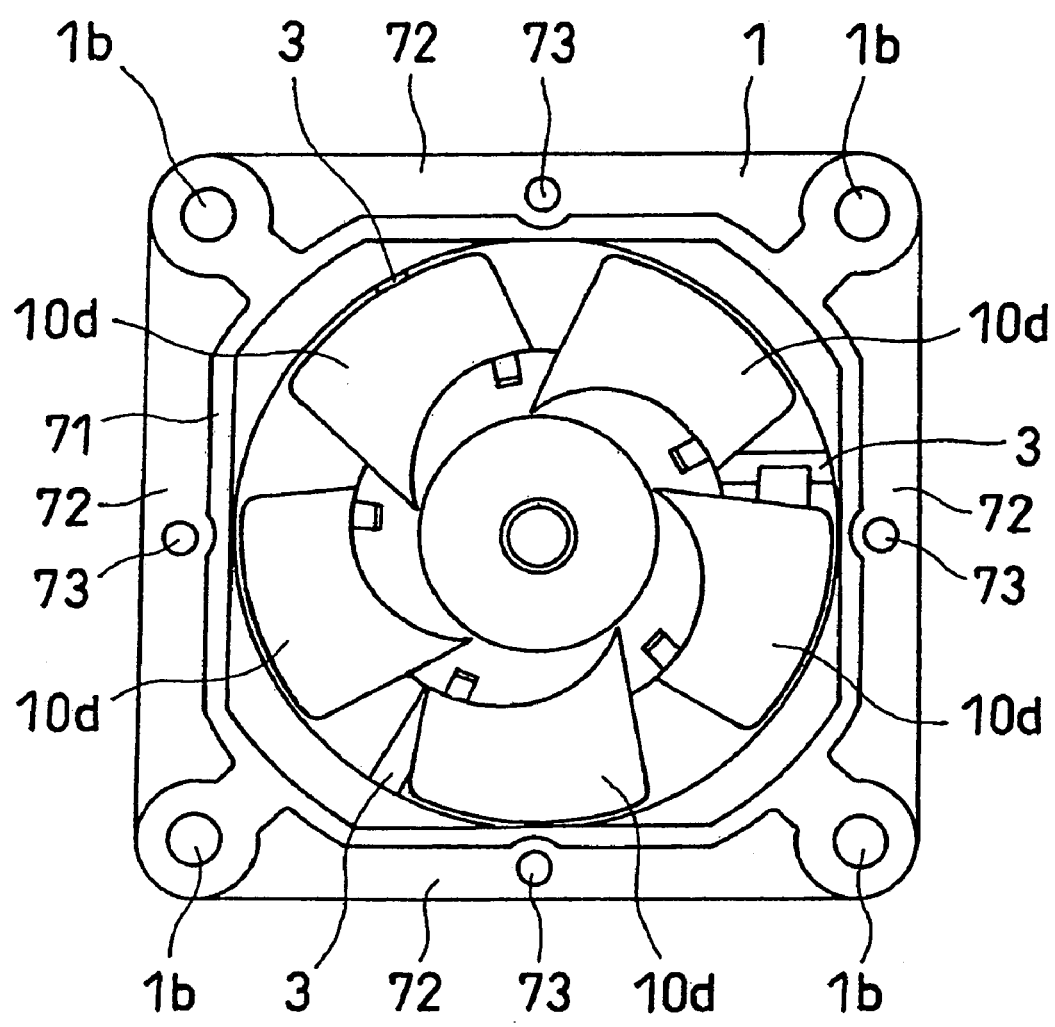
FIG. 7 is a drawing showing a serial ventilation device from the intake opening side, according to another embodiment of the present invention.

Referring now to FIG. 7, another embodiment of the serial ventilation device is shown. In this embodiment it is shown that it is acceptable to form case 1 in a square shape and set screw holes 73 for connecting fan motors I and II in peripheral region 72, which excludes square area 71 that houses the fan motor itself (like square area 31 in FIG. 2). It is to be understood that "square-shape" includes "nearly square-shape." Also, in place of holes 73, it is acceptable to use notches (not shown) similar to notch 23 shown in FIG. 5. Accordingly, in this manner screw holes 73, or similar notches, are not limited to the same positioning limits as shown in FIG. 2. The reference numbers for the elements of the fan motor shown in FIG. 7 that are identical to the elements of the fan motor in FIG. 2 are the same.

It is to be understood, of course, that the serial ventilation device of the above embodiments can be attached to the vent holes of an electronic device case (not shown) and/or an office equipment case (not shown). In such use the device would be attached, for example, with the center right side of FIG. 1 facing the exterior of the electronic device/equipment case.

In this state, if a fixed voltage of electric current is supplied to lead wires (not shown) in both fan motors I and II, each operate as follows. That is, electric current controlled by electronic circuits on PC boards 16, 16' will flow to stator coils 14, 14'. With this, magnetic flux will be generated from stator iron cores 15, 15' and motor yokes 12, 12', and impellers 10, 10' (blades 10*d*, 10*d'*) will begin forward rotation around rotation shafts 8, 8' due to the mutual magnetic effect of that magnetic flux and the magnetic flux generated by permanent magnets 13, 13'.

That is, first fan motor I rotates in counter clockwise direction α as seen from the front side of the blades (the intake opening side of the device), and will perform ventilation facing from left side 100 to the right side 100' of FIG. 1, in other words from the rear side of the ventilator towards the second ventilator. In addition, second fan motor II rotates in counter clockwise direction α as seen from the front side of the blades (i.e., from the view point "B"), and will perform ventilation from left side 100 to the right side 100' of FIG. 1, in other words to the front side of the second ventilator. The serial ventilation device as a whole will ventilate from the left side 100 of FIG. 1 toward the right side 100' (refer to arrow β).

As a result, the air in the center left side of FIG. 1, in other words the interior of the equipment case, will be sucked in and through vent holes 1*a* and will be exhausted to the center right side of FIG. 1, through the vent hole 1*a'*, in other words outside of the case. By this kind of ventilation activity the interior of the case will be cooled.

It is to be understood, of course, that while in the above embodiments an outer rotor-type motor was used as the motor to rotate the blades, it is not limited thereto, and an inner rotor-type motor can also be used. Moreover, in the above embodiments the use of the serial ventilation device inside the case of an electronic device to exhaust heat is explained, however, it is also acceptable to use the serial ventilation device to bring outside air into the electronic device case, etc., by changing the direction of ventilation to the direction opposite that of the above embodiments.

In the present invention above, a first ventilator that ventilates to the rear side of the blades and a second ventilator that ventilates to the front side of the blades when all of the blades are rotated in the same direction and in which the ventilation surface of the blades are facing the same direction is described. That is, the first ventilator is mounted to the intake opening side of a device with the front surface of its blades facing the air intake side while the second ventilator is mounted to the exhaust opening side of the device with the front surface of its blades facing the air exhaust side. Then, both ventilators are connected serially such that their rotation shafts are positioned on the same straight line. Furthermore the number of blades of the first ventilator is set higher or lower than the number of blades of the second ventilator, thus obtaining the P–Q characteristics shown, for example, in FIG. 6. In this way, airflow increase can be realized in comparison with the conventional serial ventilation device without enlarging the shape or size.

In the foregoing description, the apparatus and method of the present invention have been described with reference to specific examples. It is to be understood and expected that variations in the principles of the apparatus and method herein disclosed may be made by one skilled in the art and it is intended that such modifications, changes, and substitutions are to be included within the scope of the present invention as set forth in the appended claims. The specification and drawings are accordingly to be regarded in an illustrative rather than in a restrictive sense.

What is claimed:

1. An apparatus for a serial ventilation device comprising:
   a casing;
   a first ventilator, mounted on an air intake opening side of the casing, having a first rotating shaft and at least one intake blade having a front surface facing the air intake opening side and a rear surface, said at least one intake blade being mounted on said first rotating shaft; and
   a second ventilator, mounted on an air exhaust opening side of the casing, having a second rotating shaft and at least one exhaust blade with a front surface facing the air exhaust opening side and a rear surface, said at least one exhaust blade being mounted on said second rotating shaft,
   wherein the first ventilator performs ventilation from the front surface to the rear surface of the at least one intake blade and then towards the second ventilator, and the second ventilator performs ventilation from the rear surface to the front surface of the at least one exhaust blade and then towards the exhaust,
   further wherein said first rotating shaft is independent from and coaxial to said second rotating shaft;
   further wherein said rotating shafts rotate in opposite directions;
   further wherein each of said ventilators comprise a motor base, with an outer circular wall shaped in a tilted configuration such that a diameter of the outer circular wall of said motor base decreases to the midpoint between the first and second ventilators.

2. The apparatus according to claim 1, further comprising:
   at least one rib attached to the casing; said motor base being affixed to the at least one rib;
   a bearing support, having a tubular shape and being anchored to the motor base; and
   at least one bearing supported by the bearing support, wherein at least one of said first rotating shaft and said second rotating shaft is supported by an inner circumference of the at least one bearing.

3. The apparatus according to claim 1, wherein said first rotating shaft is coupled to an impeller, and wherein said at least one intake blade is affixed to said impeller.

4. The apparatus according to claim 1, wherein said second rotating shaft is coupled to an impeller, and wherein said at least one exhaust blade is affixed to said impeller.

5. An apparatus for a serial ventilation device, comprising:
a first ventilator having a number of intake blades mounted on a first rotating shaft; and
a second ventilator having a number of exhaust blades mounted on a second rotating shaft, said number of exhaust blades being at least one blade fewer than said number of intake blades,
wherein said first rotating shaft is independent from and coaxial to said second rotating shaft;
further wherein said rotating shafts rotate in opposite directions;
further wherein said first and second ventilators are positioned in series with respect to each other such that they ventilate air along the same line in the same direction.
wherein said first rotating shaft is coupled to an impeller, and wherein said at least one intake blade is affixed to said impeller.

6. The apparatus according to claim 5, wherein a front side of the at least one intake blade of the first ventilator faces in an opposite direction from a front side of the at least one exhaust blade of the second ventilator.

7. The apparatus according to claim 5, further comprising:
a casing in which the first and second ventilators are housed.

8. The apparatus according to claim 7, wherein the first ventilator is positioned on an air intake opening side of the casing, and the second ventilator is positioned on an air exhaust opening side of the casing.

9. The apparatus according to claim 7, further comprising:
at least one rib attached to the casing;
a motor base fixed to the at least one rib;
a bearing support, having a tubular shape and anchored to the motor base; and
at least one bearing supported by the bearing support;
wherein at least one of said first rotating shaft and said second rotating shaft is supported by an inner circumference of the at least one bearing.

10. An apparatus for a serial ventilation device, comprising:
a first ventilator having a number of intake blades mounted on a first rotating shaft; and
a second ventilator having a number of exhaust blades mounted on a second rotating shaft, said number of exhaust blades being at least one blade fewer than said number of intake blades,
wherein said first rotating shaft is independent from and coaxial to said second rotating shaft;
further wherein said rotating shafts rotate in opposite directions;
further wherein said first and second ventilators are positioned in series with respect to each other such that they ventilate air alone the same line in the same direction,
wherein said second rotating shaft is coupled to an impeller,
and wherein said at least one exhaust blade is affixed to said impeller.

* * * * *